United States Patent [19]

Martin

[11] Patent Number: 4,590,379

[45] Date of Patent: May 20, 1986

[54] ACHROMATIC DEFLECTOR AND QUADRUPOLE LENS

[76] Inventor: Frederick W. Martin, Colebrook Rd., North Stratford, N.H. 03590

[21] Appl. No.: 418,794

[22] Filed: Sep. 16, 1982

Related U.S. Application Data

[63] Continuation of Ser. No. 187,789, Sep. 16, 1980, abandoned.

[51] Int. Cl.⁴ .................. H01J 29/58; H01J 29/70
[52] U.S. Cl. .................. 250/396 R; 250/396 ML
[58] Field of Search .......... 250/396 R, 396 ML, 398, 250/296, 292

[56] References Cited

U.S. PATENT DOCUMENTS

| | | | |
|---|---|---|---|
| 2,919,381 | 12/1959 | Glaser | 250/396 R |
| 3,209,147 | 9/1965 | Dupouy et al. | 250/396 ML |
| 4,335,309 | 6/1982 | Anger et al. | 250/396 R |
| 4,362,945 | 12/1982 | Riecke | 250/396 ML |
| 4,464,573 | 8/1984 | Dalglish | 250/396 R |

FOREIGN PATENT DOCUMENTS 191010 4/1967 U.S.S.R. ............... 250/396 R

OTHER PUBLICATIONS

Szabo, "Paraxial Chromatic Aberration of Symmetrized Quadrupole Lenses", Nuc. Instru. and Methods, 106, 1973, pp. 61–64.
Kel'man, "Achromatic Quadrupole Electron Lenses", Soviet Physics-Tech. Phys., 6 (12), Jun. 1962, pp. 1052–1054.

Primary Examiner—Carolyn E. Fields

[57] ABSTRACT

The process of achromatic deflection by substantially uniform, crossed electric and magnetic fields with certain magnitudes. When the magnetic force is opposite to the electric force and twice as large, deflection is independent of particle velocity. An achromatic deflector produced by proper excitation of the poles of an achromatic quadrupole lens by means of suitable power supplies, without additional parts within the lens. An achromatic quadrupole lens having no yoke and only four electrodes, suitable for deflections varying at high frequency.

5 Claims, 8 Drawing Figures

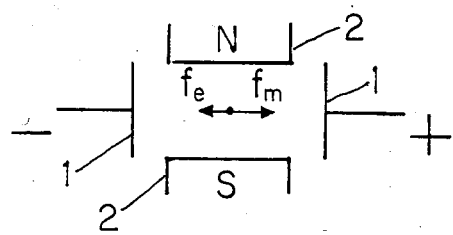
$f_m = 2 f_e$ *Fig. 1*
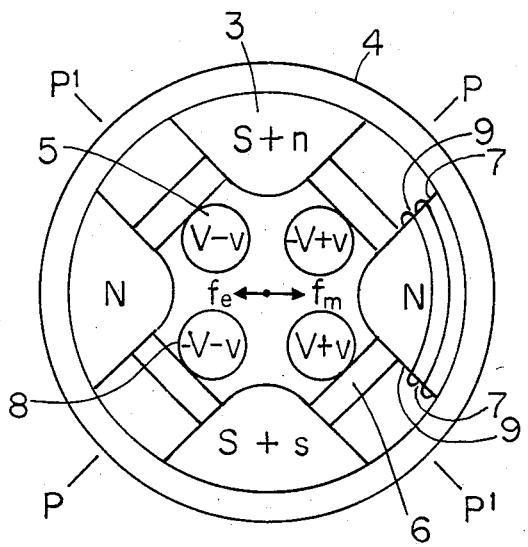
*Fig. 2*
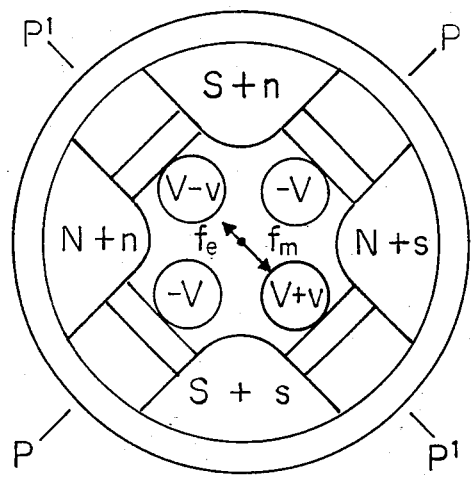
*Fig. 3*
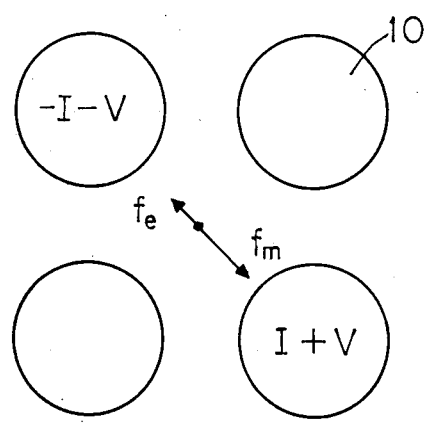
$F_m = F_e = 0$
$f_m = 2 f_e$
*Fig. 4*
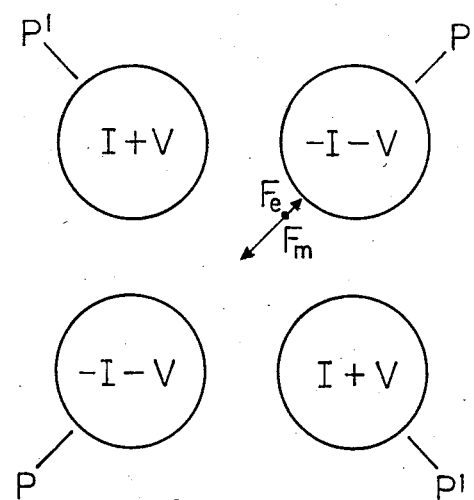
$f_m = f_e = 0$
$F_m = 2 F_e$
*Fig. 5*

ACHROMATIC DEFLECTOR AND QUADRUPOLE LENS

This is a continuation of application Ser. No. 187,789, filed Sept. 16, 1980, now abandoned.

BACKGROUND OF THE INVENTION

The invention lies in the field of electron optics, ion optics, and particle beam deflection, particularly as it is used in oscilloscopes, scanning microscopes, data storage devices, and ion-beam and electron-beam microfabrication.

In the prior art are found the parallel plate deflector and the magnetic deflector, which exert electric or magnetic forces in a sideways direction on the particles of a beam; the parabola spectrograph of Aston in which, essentially, the north and south poles of an electromagnet are simultaneously made parallel electrodes; and the Wien velocity filter, in which collinear electric and magnetic forces are used to select particles of a narrow band of velocities from a beam having a continuum of velocities.

The prior art also teaches how to focus particle beams by means of quadrupole lenses, which may be solely electric or solely magnetic. Solely magnetic quadrupole lenses which do not incorporate ferromagnetic materials are described in U.S. Pat. No. 2,919,381 of Glaser. The prior art, for instance as summarized in abandoned application Ser. No. 024,707, filed Mar. 28, 1979 of F. W. Martin, also teaches how magnetic and electric quadrupole lenses may be combined to produce achromatic focusing.

SUMMARY OF THE INVENTION

Although for many purposes typical particle beams may be considered to be monoenergetic, all beams contain particles of a continuum of velocities, distributed about the nominal value, which arises because the accelerating means employed is not perfectly stable, or because of the energy spread introduced by the source of particles. Liquid metal point sources, for example, have an energy spread as large as 40 electron volts, which is appreciable when compared to the energy of a 4 kiloelectronvolt ion beam. When a particle beam is deflected this energy spread usually produces a broadening of the beam, which can be detrimental to the resolution of devices using fine particle beams. The present invention includes a method for avoiding this broadening. When the beam is in addition focused by achromatic quadrupole lenses, the invention specifies means of excitation of such lenses which produce achromatic deflection, both in lens structures which contain magnetic yokes and which contain only wires. Containing only 4 wire electrodes, the latter is a new and simple achromatic quadrupole lens, useful at high frequencies.

DESCRIPTION OF THE DRAWINGS

In FIG. 1 a crossed-field deflector is shown, together with the critical condition for the magnitude of the fields which results in achromatic deflection. In FIGS. 2 and 3 two possible means of excitation of an achromatic quadrupole to produce achromatic deflection are shown. FIG. 4 is a cross section of a simple achromatic deflector made from four conducting wire electrodes, and FIG. 5 is a cross section of a simple achromatic quadrupole lens made from four conducting wire electrodes.

DETAILED DESCRIPTION OF THE INVENTION

Figures 6, 7:
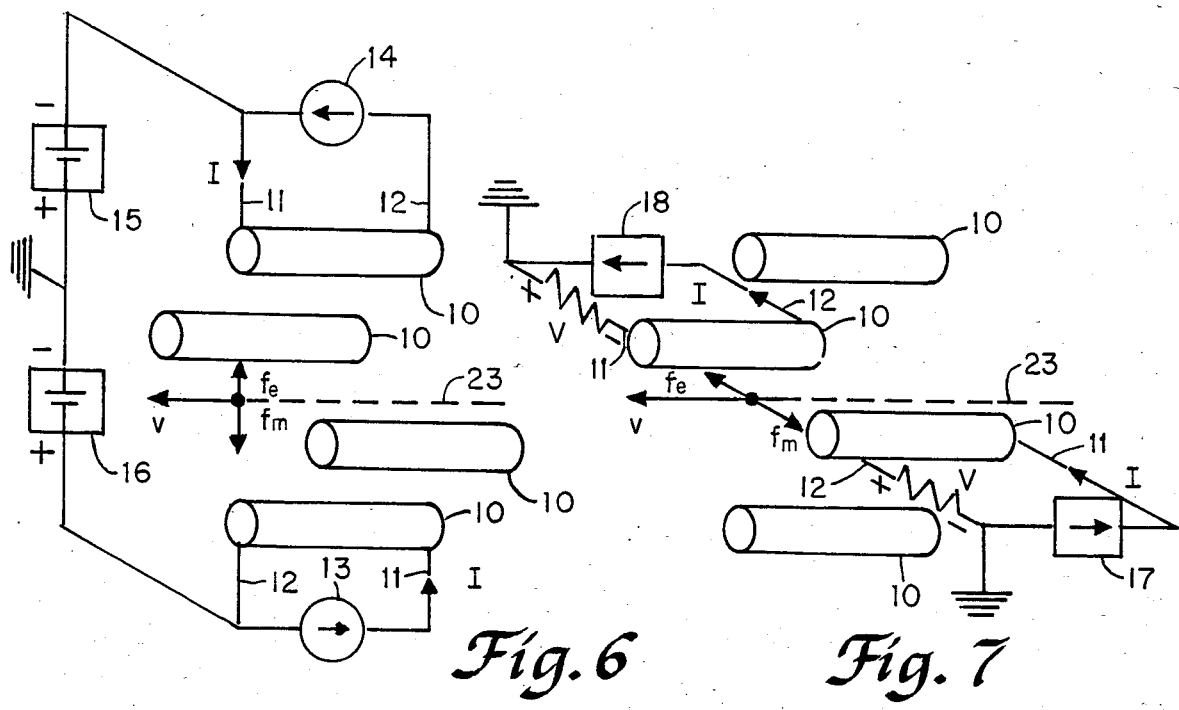
FIG. 6 is a perspective view of the four electrodes of such an achromatic deflector, which schematically indicates means of connecting power supplies to create the currents I and voltages V indicated in FIG. 4.
FIG. 7 is a similar view showing a means which requires fewer power supplies.

In FIG. 1 a cross section of a particle deflector is shown in which the electric field E and the magnetic field B are perpendicular. The electric field is substantially uniform and may be produced by parallel plates 1 to which a voltage source is attached, while the magnetic field is also substantially uniform and may be produced by an electromagnet with north and south poles 2. For particles emerging from the diagram and fields in the directions shown, the magnetic force $f_m$ on a particle and the electric force $f_e$ are collinear and opposite. Then the forces are also equal in magnitude, the equation $$v = E/B \tag{1}$$

holds true, where v is the velocity of the particle. All particles having this velocity will pass through the device without deflection, while all others will be deflected and can be intercepted by the jaws of a slit. Thus the device acts as a velocity filter.

The angle of deflection of a particle from its incident direction in a short device of this cross section having electric and magnetic fields both of length b, as computed from the sideways impulse whidh the forces impart compared to the initial momentum of the particle, will be given by $$\theta = qb(vB - E)/mv^2 \tag{2}$$

where q is the charge of the particle, b is the length of the deflector, and m is the mass of the particle.

Instead of being set by a criterion such as Eq. (1) the fields may be adjusted so that the magnetic force is twice as large as the electric force, while still oppositely directed. The deflection angle will then be independent of the velocity, as may be seen from the derivative $$d\theta/dv = -(qb/mv^2)(1 - 2E/vB) \tag{3}$$

The crossed-field device with fields selected by the criterion $$f_m = qvB = 2qE = 2f_e \tag{4}$$

thus acts as an achromatic deflector. Deflection independent of particle velocity posesses utility in devices where the field of deflection is separated into a large number of regions, such as data storage tubes and archival memories, and instruments for electron beam lithography or ion beam lithography.

Each element of length in an arbitrary trajectory of a particle may be thought of as deflection in a short device with constant fields, and if perpendicular electric and magnetic fields can be produced to cause the trajectory, it will be achromatic. It is difficult to produce the circular lines of field appropriate for modification of the magnetic solenoid lens or the cylindrical electrostatic lens, but appropriate fields may readily be produced with the structures of achromatic quadrupole lenses, which heretofore have not commonly been provided with means to effect achromatic deflection in addition to achromatic focusing.

In FIG. 2 is shown an achromatic quadrupole lens with four magnetic poles 3 attached to a yoke 4 and four electric poles 5 on insulating supports 6. In order to produce focusing the magnetic poles are excited with equal strengths and with polarities as shown by the capital letters N, S, while the electric poles are excited with the voltages $+V$, $-V$.

Near the center of the lens a focusing action is produced as is well known in the prior art. At the center the forces $F_e$ and $F_m$ produced by the quadrupole lens excitation are both zero, and no particle deflection is produced. Commonly the magnetic excitations are produced by running a single current in the proper directions through identical coils 7 wound on each pole, while the electric excitation is provided through leads 8 attached to a high voltage DC supply, which may have a center tap connected to the yoke.

A quadrupole lens acts differently in two perpendicular planes, known as the principal sections, which intersect along its axis. In one principal section denoted P the lens exerts a focusing effect, and in the other principal section denoted P' it exerts a defocusing effect. It is consequently necessary to construct systems with at least two quadrupole lenses in succession along the beam axis, in order to produce converging action in both sections of the system.

When two magnetic poles at opposite ends of a diameter of the lens structure shown in FIG. 2 are excited with pole strengths n, s (shown as lower-case letters) in addition to the lens excitations N, S, while two electrodes on one side of the diameter are simultaneously excited with a strength $+v$ and two electrodes on the other side of the diameter are excited with a strength $-v$, collinear deflecting fields $f_m$ and $f_e$ will be produced at the center of the lens. These fields are nearly perpendicular to the initial direction of motion of a particle, just as they are in the crossed field deflector of FIG. 1, and they will impart a sideways impulse which causes the emerging trajectory of the particle to deviate by some angle from its initial direction. Achromatic deflection will result when the excitations are applied in the ratio $f_m = 2f_e$. For this purpose an additional deflecting power supply must be attached to the equipment, and its output must be applied in the proper ratio to the proper combination of poles. In one configuration separate windings 9 may be added to the poles, and the output may be used to send a current through the auxiliary windings on opposite poles. In another configuration, the poles may have only one winding, and the winding may be driven by an amplifier at the input of which signals from the focusing supply and the deflection supply are added. For the electric poles, a separate amplifier may be used for each electrode, at the input of which signals from the focusing supply and the deflection supply are added.

Deflection in two perpendicular directions may be arranged using this scheme on the two perpendicular diameters of the quadrupole lens. Combined deflection and focusing of this type is described theoretically in an article "Paraxial Chromatic Aberration of Asymmetrized Quadrupole Lenses," by Gy. Szabo (Nuclear Instruments and Methods 106 (1973) 61–64).

An alternative method of exciting the quadrupole lens structure is shown in FIG. 3, whereby deflection is produced in the principal sections of the lens rather than in the planes of the magnetic poles.

The yoke 4 is often made of steel, while the poles 3 are often iron. When it is desired to sweep a particle beam rapidly, or to move it rapidly from one fixed deflection to another fixed deflection, the inductance of this structure prevents rapid changes in the excitation of the coils which drive the poles. Eddy currents within the poles and yoke worsen this situation, and although they may be eliminated by making these parts from non-conducting ferromagnetic materials such as sintered iron powders or ferrites, the basic inductance of a structure excited by coils containing many turns remains. To further improve the situation, the number of turns in a coil may be decreased and the current increased correspondingly, but in such a case the structure of FIG. 4 may be simpler to fabricate.

FIG. 4 is a cross section of a deflector which uses four current-carrying electrodes 10 instead of the eight poles of FIGS. 2 and 3. Electrodes of this structure carry currents in a direction parallel to the lens axis and in addition differ in voltage by substantial predetermined amounts. To produce achromatic deflection, equal currents I, opposite to each other in direction, can be run through electrodes at either end of a diameter, and equal voltages V of opposite polarity with respect to ground can be applied to the same poles, as shown in FIG. 4. For each electrode the current I must be supplied by a pair of leads, one connected at each end of the electrode. These are shown in FIGS. 6 and 7 as incoming lead 11 and outgoing lead 12. The equal currents I are run through the electrodes at either end of a diameter of the lens structure by means of adjustable power supplies 13 and 14. The equal voltages V are applied to the same electrodes by adjustable power supplies 15 and 16. The four power supplies 13, 14, 15, 16 are adjusted to produce the sense of current I and sense of voltage V shown in FIG. 4. Means may be provided for adjusting the relative magnitude of the electric and magnetic deflecting fields. Both the current I and the voltage V may be provided at once by connecting a resistor of predetermined size between one lead and ground, and a power supply of correct polarity and voltage between the other lead and ground. This scheme is shown in FIG. 7, where only two adjustable power supplies 17, 18 are required to excite the deflecting electrodes with both the current I and voltage V shown in FIG. 4. Excitation for the purpose of deflection produces collinear forces on a particle travelling along the axis 23, as shown in FIGS. 6 and 7, and when the magnetic force is adjusted to be twice the magnitude of the electric force and oppositely directed, the deflection will be achromatic.

Deflection in two perpendicular directions may be arranged by using the scheme shown in FIG. 4 on the two perpendicular diameters of the quadrupole lens, that is, as shown in FIG. 7, by excitation of the two electrodes which are not shown as excited in FIG. 4 and FIG. 6.

Figure 8:
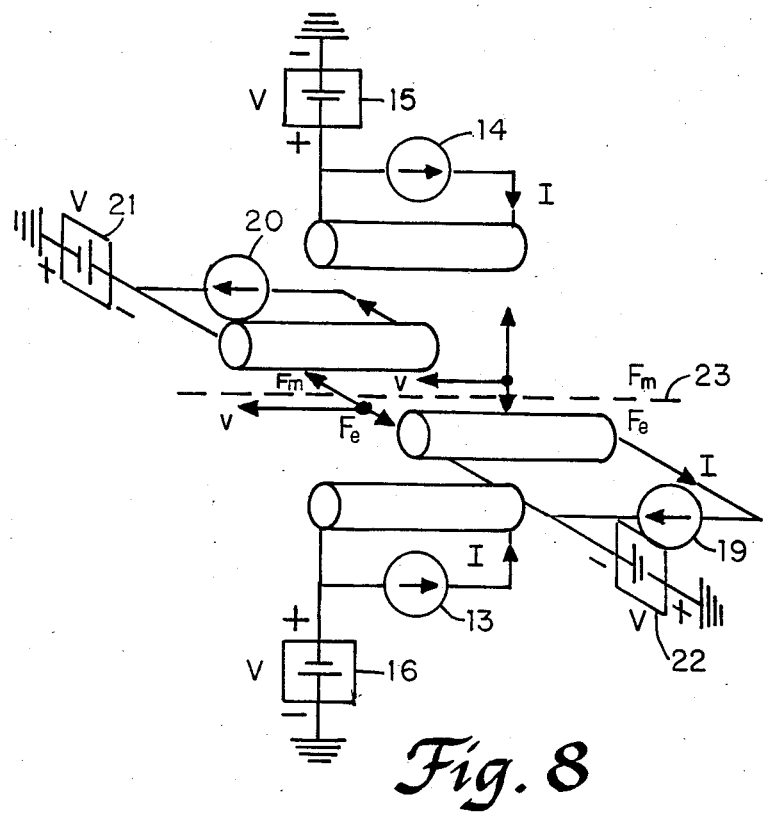
FIG. 8 is a perspective view of the four electrodes of an achromatic quadrupole lens, which schematically indicates a means of connecting power supplies to create the currents I and voltages V shown in FIG. 5.

To produce achromatic quadrupole lens action, the structure of FIG. 4 may be energized with equal currents in all four electrodes, and voltages of equal magnitude with respect to ground upon all four electrodes, as shown in FIG. 5. As shown in FIG. 8, four adjustable current supplies 13, 14, 19, 20 are required to produce equal currents and four adjustable voltage supplies 15, 16, 21, 22 are required to produce voltages of equal magnitude. In order to produce the sense of current I and sense of voltage V shown in FIG. 5, the supplies are adjusted such that adjacent electrodes have opposite directions of current and opposite voltages with respect to ground. In first approximation both the magnetic and electric fields of a single electrode will have an $r^{-1}$ dependence upon the radius r from the center of the electrode. The electric field will be radial and the magnetic field tangential to circles centered on the electrode, so that the fields are perpendicular and the forces of a single electrode on a particle travelling parallel to the axis will be collinear. When adjusted to the strength specified by Eq. (4), the action of each electrode will be achromatic and the lens action of the four electrodes at once consequently will be achromatic. In higher approximation such effects as non-uniform surface charges on the electrodes and non-uniform internal current density must be considered; but because of the symmetry of the structure, strong quadrupole components of the magnetic and electric force fields will exist at the center.

What is claimed is:

1. The method of achromatic deflection of particles which comprises:

forming a substantially uniform electric field between electrodes radially spaced on either side of a common longitudinal axis and a substantially coincident, substantially uniform magnetic field perpendicular to said electric field;

adjusting the strengths of said fields so that the magnetic force on a particle travelling parallel to said axis is twice the electric force on said particle in magnitude and opposite in direction; and deflection of the direction of travel of particles emergent from said fields from said axis by an angle dependent on the magnitude of said field strengths so adjusted, whereby said angle does not depend on the velocity of the particle.

2. An improved quadrupole lens comprising four parallel conducting wire electrodes, equally spaced from a common axis and arranged at an angular interval of 90 degrees around said axis, a lead-in wire at each end of each electrode, and currents flowing in a direction substantially parallel to said axis within each electrode and in opposite direction to the current in adjacent electrodes, said currents being such as to create a magnetic quadrupole force field; wherein the improvement comprises adjustable power supply means which create voltage differences of substantial, equal magnitude between adjacent electrodes and of polarity such that electrodes on opposite sides of said common axis have the same voltage with respect to ground, said voltage differences being such as to create an electric quadrupole force field; and wherein the adjustable power supply means maintain the ratio of the magnitudes of the electric and magnetic quadrupole fields such that the focal lengths of the improved lens are independent of particle velocity, and the lens functions as an achromatic lens.

3. The method of achromatic focusing of particles which comprises:

providing an improved quadrupole lens comprising four parallel conducting wire electrodes, equally spaced from a common axis and arranged at an angular interval of 90 degrees around said axis, a lead-in wire at each end of each electrode, and currents flowing in a direction substantially parallel to said axis within each electrode and in opposite direction to the current in adjacent electrodes, said currents being such as to create a magnetic quadrupole force field; wherein the improvement comprises using adjustable power supplies which create voltage differences of substantial, equal magnitude between adjacent electrodes and of polarity such that electrodes on opposite sides of said common axis have the same voltage with respect to ground, said voltage differences being such as to create an electric quadrupole force field;

and adjusting said currents and voltage differences so that the magnetic quadrupole force is approximately twice the magnitude of the electric quadrupole force and of opposite direction at each point within said lens, thereby making the focal lengths of the lens independent of particle velocity.

4. Means for simultaneous achromatic focusing and achromatic deflection of a beam of particles comprising:

an improved achromatic quadrupole lens comprising four parallel conducting wire electrodes, equally spaced from a common axis and arranged at an angular interval of 90 degrees around said axis, a lead-in wire at each end of each electrode, and currents flowing in a direction substantially parallel to said axis within each electrode and in opposite direction to the current in adjacent electrodes, said currents being such as to create a magnetic quadrupole force field;

wherein the improvement comprises adjustable power supply means which create voltage differences of substantial, equal magnitude between adjacent electrodes and of polarity such that electrodes on opposite sides of said common axis have the same voltage with respect to ground, said voltage differences being such as to create an electric quadrupole force field; and wherein the adjustable supply means maintain the ratio of the magnitudes of the electric and magnetic quadrupoles fields such that the focal lengths of the improved lens are independent of particle velocity;

and an achromatic deflection means, which comprises adjustable power supply means connected to said wire electrodes and energizing a magnetic deflection force field within said lens, said force field being substantially perpendicular to the axis of said lens, and adjustable power supply means connected to said wire electrodes and energizing an electric deflecting force field within said lens, said electric force field being collinear with said magnetic force field at points along said axis;

and means for adjusting the relative magnitude of said fields so that the magnetic deflection force on a particle travelling along said axis is twice the electric deflecting force on said particle in magnitude and opposite in direction;

in which case said achromatic deflecting means affects the angle at which particles emerge from the lens by an amount dependent on the magnitude of said field strengths so adjusted and independent of particle velocity.

5. The method of achromatic focusing and achromatic deflection of particles which comprises:

providing an improved quadrupole lens comprising four parallel conducting wire electrodes, equally spaced from a common axis and arranged at an angular interval of 90 degrees around said axis, a lead-in wire at each end of each electrode, and currents flowing in a direction substantially parallel to said axis within each electrode and in opposite direction to the current in adjacent electrodes, said currents being such as to create a magnetic quadrupole force field; wherein the improvement comprises using adjustable power supplies which create voltage differences of substantial, equal magnitude between adjacent electrodes and of polarity such that electrodes on opposite sides of said common axis have the same voltage with respect to ground, said voltage differences being such as to create an electric quadrupole force field;

providing an achromatic deflection means, which comprises adjustable power supplies connected to said wire electrodes and energizing a magnetic deflection force field within said lens, said force field being substantially perpendicular to the axis of said lens, adjustable power supplies connected to said wire electrodes and energizing an electric deflecting force field within said lens, said electric force field being collinear with said magnetic force field at points along said axis, and means for adjusting the relative magnitude of said deflecting fields;

adjusting the quadrupole force fields so that the magnetic quadrupole force is approximately twice the magnitude of the electric quadrupole force and of opposite direction at each point within the lens, thereby making an achromatic quadrupole lens in which the focal lengths are independent of particle velocity;

and adjusting said deflecting force fields so that the magnetic deflection force on a particle travelling along said axis is twice the electric deflecting force on said particle in magnitude and opposite in direction, thereby making an achromatic deflecting means which affects the angle at which particles emerge from the lens by an amount dependent on the magnitude of said deflecting fields so adjusted and independent of particle velocity.

* * * * *